(12) United States Patent
Wei et al.

(10) Patent No.: US 12,114,511 B2
(45) Date of Patent: Oct. 8, 2024

(54) SEMICONDUCTOR DEVICE, INTEGRATED CIRCUIT AND METHOD OF MANUFACTURING THE SAME

(71) Applicant: TAIWAN SEMICONDUCTOR MANUFACTURING COMPANY LTD., Hsinchu (TW)

(72) Inventors: Hui-Hsien Wei, Taoyuan (TW); Yen-Chung Ho, Hsinchu (TW); Chia-Jung Yu, Hsinchu (TW); Yong-Jie Wu, Hsinchu (TW); Pin-Cheng Hsu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 483 days.

(21) Appl. No.: 17/462,577

(22) Filed: Aug. 31, 2021

(65) Prior Publication Data
US 2023/0063125 A1    Mar. 2, 2023

(51) Int. Cl.
*H01L 29/82*    (2006.01)
*H10B 61/00*    (2023.01)
*H10N 50/01*    (2023.01)
*H10N 50/10*    (2023.01)
*H10N 50/80*    (2023.01)

(52) U.S. Cl.
CPC ............. *H10B 61/22* (2023.02); *H10N 50/01* (2023.02); *H10N 50/10* (2023.02); *H10N 50/80* (2023.02)

(58) Field of Classification Search
None
See application file for complete search history.

(56) References Cited

U.S. PATENT DOCUMENTS

| | | | |
|---|---|---|---|
| 2019/0267319 A1* | 8/2019 | Sharma | H01L 29/786 |
| 2021/0296396 A1* | 9/2021 | Wu | H10N 70/011 |
| 2023/0352539 A1* | 11/2023 | Jeong | H01L 21/02488 |

* cited by examiner

*Primary Examiner* — Asok K Sarkar
(74) *Attorney, Agent, or Firm* — WPAT LAW; Anthony King

(57) ABSTRACT

A semiconductor device, an integrated circuit, and a method of manufacturing the same are provided. The semiconductor device includes a substrate, a thin-film transistor (TFT) over the substrate, and a magnetoresistive random-access memory (MRAM) cell electrically coupled to the TFT. The TFT includes a gate electrode; a gate dielectric layer disposed over the gate electrode; source/drain electrodes disposed above the gate electrode; and an active layer disposed above the gate electrode. A protection layer is disposed between the TFT and the MRAM cell and electrically connects the MRAM cell to the TFT.

20 Claims, 7 Drawing Sheets

SEMICONDUCTOR DEVICE, INTEGRATED CIRCUIT AND METHOD OF MANUFACTURING THE SAME

BACKGROUND

Many electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. A magnetic random access memory (MRAM) device is currently explored to facilitate a static random access memory (SRAM) to own a high non-volatile storage density. The MRAM device includes an array of densely packed MRAM cells. In each MRAM cell, a magnetic tunneling junction (MTJ) element is integrated with a transistor to perform write and read operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
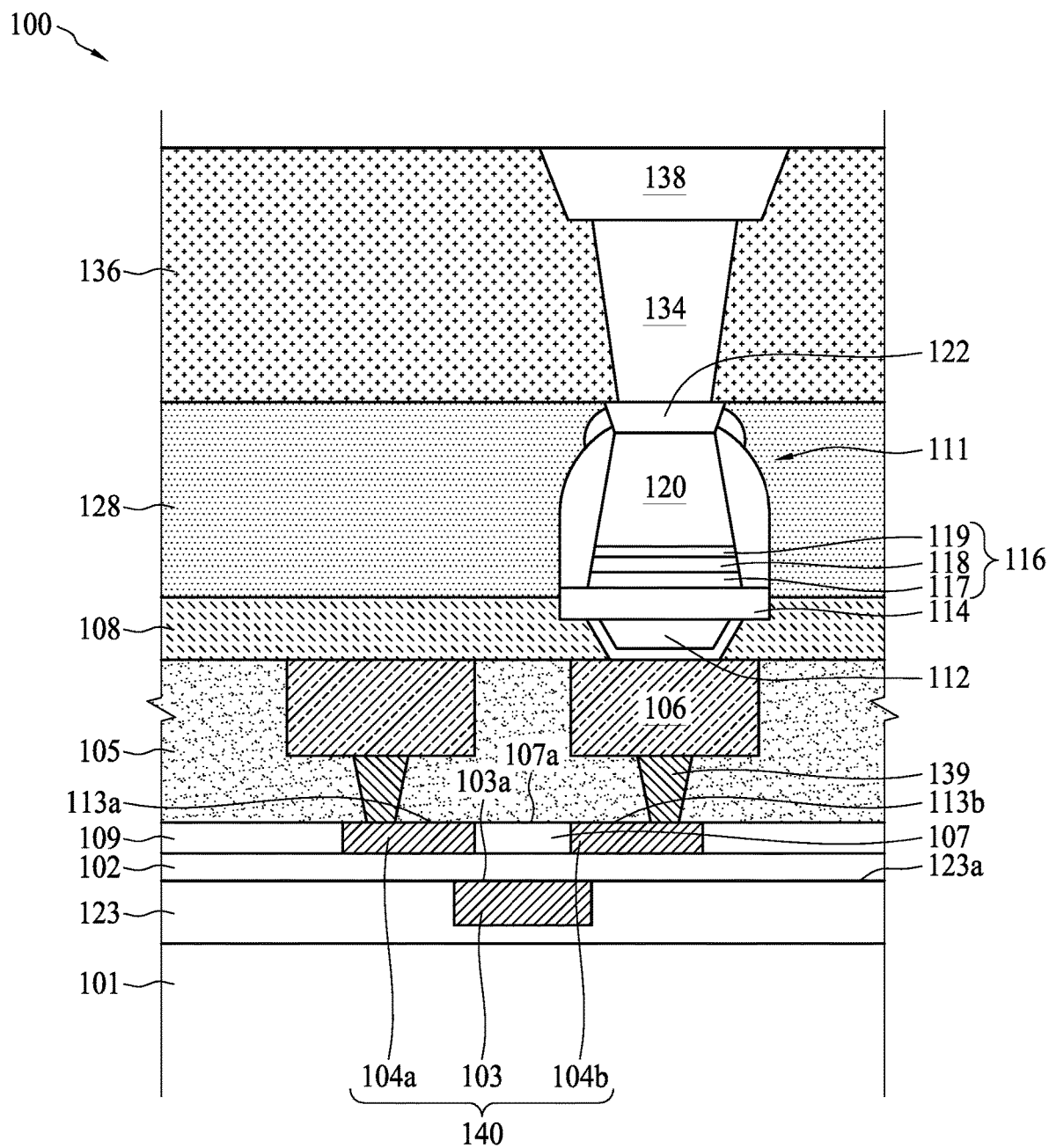
FIG. 1 illustrates a cross-sectional view of a memory device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to 10% of an average of the values, such as less than or equal to ±5%, less than or equal to ±4%, less than or equal to ±13%, less than or equal to 2%, less than or equal to ±1%, less than or equal to ±0.5%, less than or equal to 0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°.

An integrated circuit (IC) often comprises a back-end-of-line (BEOL) interconnect structure and semiconductor devices on a front side of a semiconductor substrate. The semiconductor devices may include, for example, various n-type metal-oxide (NMOS) and/or p-type metal-oxide semiconductor (PMOS) devices, such as transistors, capacitors, resistors, diodes, photo-diodes, fuses, magnetic random access memory (MRAM) cells, and the like. The semiconductor devices may, for example, be in the BEOL interconnect structure, and/or between the semiconductor substrate and the BEOL interconnect structure. A technical problem may reside in how to provide sufficient power to the semiconductor devices or how to reduce the power consumption thereof.

In view of the foregoing, the present disclosure is directed to an IC, where semiconductor devices, such as MRAM cells are arranged within a BEOL interconnect structure, of which at least one of the technical problems mentioned above may be resolved.

FIG. 1 illustrates a cross-sectional view of a memory device 100 according to some embodiments of the present disclosure. The memory device 100 includes a substrate 101, a thin-film transistor (TFT) 140, and a magnetoresistive random-access memory (MRAM) cell 111.

The substrate 101 may be, for example, a bulk semiconductor substrate (e.g., a bulk silicon substrate) or a silicon-on-insulator (SOI) substrate, or a wafer. An SOI substrate may include a layer of a semiconductor material, such as silicon, formed on an insulating layer. The insulating layer may be, for example, a buried oxide layer or a silicon oxide layer. The insulating layer is provided on a substrate, typically, a silicon or glass substrate. Other substrates, such as a multi-layered or gradient substrate may also be used. The substrate 101 may include electrical devices such as various n-type metal-oxide (NMOS) and/or p-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, and the like.

The process forming the individual devices such as transistors, capacitors, resistors, diodes, photo-diodes, fuses, and the like within the substrate 101 may be collectively referred as the front-end-of-line (FEOL) process, which is the first portion of integrated circuit (IC) fabrication where the individual devices (transistors, capacitors, resistors, etc.) are patterned in a substrate (e.g., wafer). FEOL generally covers everything up to (but not including) the deposition of metal layers.

Following the FEOL process is the back-end-of-line (BEOL) process, which is the second portion of IC fabrication where the individual devices are interconnected with wiring or metal layers on the IC. The BEOL process generally begins when the first metal layer or $M_1$ is deposited on the wafer. It may include contacts, insulating layers, metal layers, and bonding sites for chip-package connections. As a result, one or more metal layers, $M_1$-$M_n$, may be formed over an interlayer dielectric (ILD) layer. A typical IC may include three or more metal layers, followed by a final passivation layer. The final passivation layer may be used for protecting the IC from mechanical abrasion during probe and packaging and to provide a barrier to contaminants. After the final passivation layer, the bonding pads for input/output will be formed, followed by a post-fabrication process such as wafer probe, die separation, and packaging. In more details, the BEOL process may include: adding a metal layer $M_n$, adding an intra metal dielectric (IMD) layer, making vias through the IMD layer to connect to lower metal layer contacts, and forming higher metal layer contacts connected to the vias.

The thin-film transistor (TFT) 140 may be disposed over a first ILD layer 123 disposed over the substrate 101 during the BEOL process. A portion of the TFT 140 may be disposed within the first ILD layer 123. The first ILD layer 123 may include a low dielectric constant (k value less than about 2.5) material. For example, the first ILD layer 123 may include, for example, an oxide, silicon dioxide ($SiO_2$), borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS).

The TFT 140 may include a gate electrode 103, a gate dielectric layer 102, and source/drain electrodes 104a, 104b. The TFT 140 may be polycrystalline silicon TFT or amorphous silicon TFT.

The gate electrode 103 is disclosed within the first ILD layer 123. The gate electrode 103 may have an upper surface 103a exposed from an upper surface 123a of the first ILD layer 123. In some embodiments, the gate electrode 103 has an upper surface 103a substantially coplanar with an upper surface 123a of the first ILD layer 123. The gate electrode 103 may include silicon, glass, plastic, or any other appropriate material, or may include a metal or any other appropriate conductive material. In some embodiments, the gate electrode 103 include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the gate electrode 103 may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The gate dielectric layer 102 is disposed over the first ILD layer 123 and the gate electrode 103. The gate dielectric layer 102 may include a high-k material (e.g., k value not less than 20). For example, the gate dielectric layer 102 may include a material selected from the group consisting of silicon oxide ($SiO_2$), silicon nitride ($SiN_x$), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), a bismuth-zinc-niobium-oxygen compound (Bi—Zn—Nb—O), and a combination thereof. In some embodiments, the gate dielectric layer 102 includes hafnium oxide ($HfO_2$).

The source/drain electrodes 104a, 104b are disposed over the gate dielectric layer 102. The source/drain electrodes 104a, 104b are separated from each other by an active layer 107 formed over the gate dielectric layer 102 above the gate electrode 103. The source/drain electrodes 104a, 104b may have an upper surface 113a, 113b exposed from an upper surface 107a of the active layer 107. In some embodiments, the source/drain electrodes 104a, 104b have an upper surface 113a, 113b substantially coplanar with an upper surface 107a of the active layer 107. The source/drain electrodes 104a, 104b may include the same material as that of the gate electrode 103. For example, the source/drain electrodes 104a, 104b may include a metal or any other appropriate conductive material. In some embodiments, the source/drain electrodes 104a, 104b include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the source electrode 104a and the drain electrode 104b may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The active layer 107 serves to form a channel allowing electrons to move therein between the source/drain electrodes 104a, 104b. The active layer 107 may comprise an oxide semiconductor material including, for example, silicon, IGZO, ITZO, IZO, AGZO, or a combination thereof. In some embodiments, the active layer 107 includes IGZO.

The MRAM cell 111 is electrically coupled to the TFT 140. The MRAM cell 11l may be electrically coupled to the TFT 140 by a first metal line 112 disposed under the bottom electrode 114. In some embodiments, the MRAM cell 111 is electrically coupled to the TFT 140 through the first metal line 112, the first interconnect line 106, and the first conductive via 139. The TFT 140 may be disposed between the MRAM cell 111 and the substrate 101 in a BEOL structure. Alternatively, the TFT 140 may be disposed above the MRAM cell 111.

A bit line (BL) may be electrically coupled to one end of the MRAM cell 111 by a second interconnect line 138 above the top electrode 120. In some embodiments, the MRAM cell 111 is electrically coupled to the BL through the second conductive via 122, the third conductive via 134, and the second interconnect line 138. A source line (SL) may be electrically coupled to an opposite end of the MRAM cell 111 through the TFT 140. Thus, application of a suitable word line (WL) voltage to the gate electrode 103 of the TFT 140 electrically couples the MRAM cell 111 between the BL and the SL. Consequently, by providing suitable bias conditions, the MRAM cell 111 can be switched between two states of electrical resistance, a first state with a low-resistance and a second state with a high-resistance, to store data. The MRAM cell 111 may be disposed within an interlayer dielectric (ILD) layer or an inter-metal dielectric (IMD) layer 128 or a BEOL structure over the substrate 101. The MRAM cell 111 may include a bottom electrode 114, a magnetic tunnel junction (MTJ) 116, and a top electrode 120.

A portion of the bottom electrode 114 may be disposed in a dielectric layer 108 adjacent to the IMD layer 128. The bottom electrode 114 may include, for example, tantalum, tantalum nitride, or ruthenium.

The MTJ 116 may be disposed adjacent to the bottom electrode 114. In some embodiments, the MTJ 116 is disclosed on the bottom electrode 114. The MTJ 116 may include a lower ferromagnetic electrode 117 and an upper ferromagnetic electrode 119, which may be separated from each other by a tunneling barrier layer 118. In some embodiments, the lower ferromagnetic electrode 117 has a fixed or "pinned" magnetic orientation, while the upper ferromagnetic electrode 119 has a variable or "free" magnetic orientation, which may be switched between two or more distinct magnetic polarities that each represents a different data state, such as a different binary state. A "fixed" ferromagnetic layer refers to one having a magnetic orientation that is "fixed." A "free" ferromagnetic layer refers to one that is capable of changing its magnetic orientation between two magnetic states. If the magnetic orientations of the pinned ferromagnetic electrode 117 and the free ferromagnetic electrode 119 are in a parallel orientation, it is more likely that electrons will tunnel through the tunneling barrier layer 118, so the MTJ 116 is in a low-resistance state. Conversely, if the magnetic orientations of the pinned ferromagnetic electrode 117 and the free ferromagnetic electrode 119 are in an anti-parallel orientation, it is less likely that electrons will tunnel through the tunneling barrier layer 118, so the MTJ 116 is in a high-resistance state. Because of this binary nature, the MTJ 116 may be used in memory cells to store digital data, with the low-resistance state corresponding to a first data state (e.g., logical "0") and the high-resistance state corresponding to a second date state (e.g., logical "1"). In some embodiments, the MTJ may be vertically "flipped" such that the lower magnetic electrode 117 has a "free" magnetic orientation, while the upper ferromagnetic electrode 119 has a "pinned" magnetic orientation. In some embodiments, the lower ferromagnetic electrode 117 includes iron, cobalt, nickel, iron cobalt, nickel cobalt, cobalt iron boride, iron boride, iron platinum, iron palladium, or the like. In some embodiments, the upper ferromagnetic electrode 119 includes iron, cobalt, nickel, iron cobalt, nickel cobalt, cobalt iron boride, iron boride, iron platinum, iron palladium, or the like.

The tunneling barrier layer 118 provides electrical isolation between the upper ferromagnetic electrode 119 and the lower ferromagnetic electrode 117, while still allows electrons tunnel through under proper conditions. The tunneling barrier layer 118 may include, for example, magnesium oxide, aluminum oxide (e.g., $Al_2O_3$), nickel oxide, gadolinium oxide, tantalum oxide, molybdenum oxide, titanium oxide, tungsten oxide, or the like.

The top electrode 120 electrically couples the second conductive via 122 to the MTJ 116. The top electrode 120 may include, for example, tantalum, tantalum nitride, or ruthenium.

Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption. Therefore, MRAM is one promising candidate for next generation non-volatile electronic memory due to advantages over current electronic memory. Since MRAM is preferably disposed in the BEOL interconnect structure, and/or between the semiconductor substrate and the BEOL interconnect structure, a TFT is preferably used to provide power to the MRAM as the BEOL process cannot perform a temperature as higher as in the FEOL process (the process temperature in the BEOL process is typically below 400° C.), which makes a TFT a better choice compared to other transistors to be electrically coupled to the MRAM as it can be made under the BEOL process temperature. Nevertheless, as continuing demand requests smaller size of the TFT and thus smaller metal pitches, a technical problem may reside in how to provide a TFT with stable performance and faster response time when considering applying a TFT in a BEOL structure. For example, a technical problem may reside in how to balance the stress caused by the gate electrode of a TFT, increase the electron mobility of the active layer of a TFT, and protect the source/drain electrodes of a TFT.

In view of the foregoing, the present disclosure further provides the following embodiments that may resolve at least one of the problems mentioned above.

Figure 2:
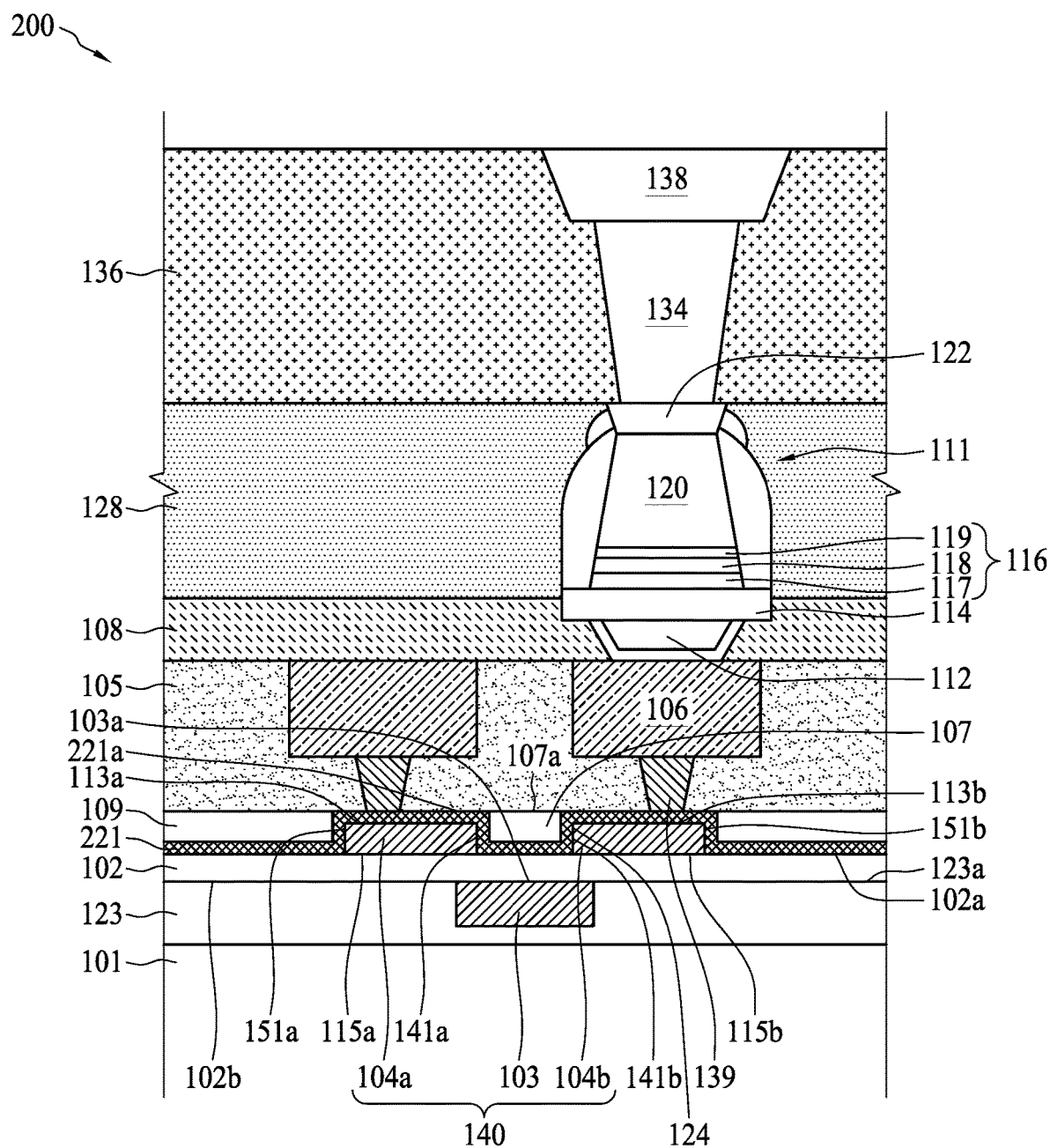
FIG. 2 illustrates a cross-sectional view of a memory device according to some embodiments of the present disclosure.

FIG. 2 illustrates a cross-sectional view of a memory device 200 according to some embodiments of the present disclosure. The memory device 200 illustrated in FIG. 2 is similar to that illustrated in FIG. 1 with a difference including that at least one protection layer 221 is disposed between the TFT 140 and the MRAM cell 111.

The TFT 140 may include a gate electrode 103, a gate dielectric layer 102, source/drain electrodes 104a, 104b, and an active layer 107. The TFT 140 may be polycrystalline silicon TFT or amorphous silicon TFT.

The gate electrode 103 is disclosed in a dielectric layer 123 (e.g., a first ILD layer) over a substrate 101. The gate electrode 103 may have an upper surface 103a exposed from an upper surface 123a of the first ILD layer 123. In some embodiments, the gate electrode 103 has an upper surface 103a substantially coplanar with an upper surface 123a of the first ILD layer 123. The gate electrode 103 may include silicon, glass, plastic, or any other appropriate material, or may include a metal or any other appropriate conductive material. In some embodiments, the gate electrode 103 include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the gate electrode 103 may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The gate dielectric layer 102 is disposed over the first ILD layer 123. The gate dielectric layer 102 may include a high-k material (e.g., k value not less than 20). For example, the gate dielectric layer 102 may include a material selected from the group consisting of silicon oxide ($SiO_2$), silicon nitride ($SiN_x$), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), a bismuth-zinc-niobium-oxygen compound (Bi—Zn—Nb—O), and a combination thereof. In some embodiments, the gate dielectric layer 102 includes hafnium oxide ($HfO_2$).

The source/drain electrodes 104a, 104b are disposed over the gate dielectric layer 102. The source/drain electrodes 104a, 104b and the gate electrode 103 may be separated by the gate dielectric layer 102. The source/drain electrodes 104a, 104b may be spaced from the gate electrode 103 by the gate dielectric layer 102. An upper surface 113a, 113b of the source/drain electrodes 104a, 104b may be adjacent to the protection layer 221 and a bottom surface 115a, 115b of the source/drain 104a, 104b may be adjacent to the gate dielectric layer 102.

The source/drain electrodes 104a, 104b may define an opening 124. At least a portion of the upper surface 113a, 113b of the source/drain electrodes 104a, 104b may be covered by the protection layer 221. At least a portion of one of the first side surface 141a, 141b and the second side surface 151a, 151b of the source/drain electrodes 104a, 104b may be covered by the protection layer 221. In some embodiments, at least a portion of the first side surface 141a, 141b, the upper surface 113a, 113b, and the second side surface 151a, 151b of the source/drain electrodes 104a, 104b are covered by the protection layer 221. The source/drain electrodes 104a, 104b may have an upper surface 113a, 113b lower than an upper surface 107a of the active layer 107.

The source/drain electrodes 104a, 104b may include the same material as that of the gate electrode 103. For example, the source/drain electrodes 104a, 104b may include a metal or any other appropriate conductive material. In some embodiments, the source/drain electrodes 104a, 104b include a material selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), and a combination thereof. Also, a material used to form the source electrode 104a and the drain electrode 104b may include a conductive metal selected from the group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), and a combination thereof.

The active layer 107 serves to form a channel allowing electrons to move therein between the source/drain electrodes 104a, 104b. A portion of the active layer 107 may be disposed within the opening 124 defined by the source/drain electrodes 104a, 104b. The active layer 107 may have an upper surface 107a substantially coplanar with an upper surface 221a of the protection layer 221. The active layer 107 and the gate electrode 103 may be separated by the protection layer 221 and the gate dielectric layer 102. The active layer 107 and the gate dielectric layer 102 may be separated from each other by the protection layer 221. The active layer 107 may comprise an oxide semiconductor material including, for example, silicon, IGZO, ITZO, IZO, AGZO, or a combination thereof. In some embodiments, the active layer 107 includes IGZO.

The protection layer 221 is disposed between the source/drain electrodes 104a, 104b of the TFT 140 and the first interconnect line 106 the electrically connects to the MRAM cell 111. The protection layer 221 may serve to balance the stress caused by the gate electrode 103 of the TFT 140. In some embodiments, the protection layer 221 serves to balance the tensile stress caused by the gate electrode 103 of the TFT 140. The protection layer 221 may serve to increase the electron mobility of the active layer 107 by increasing the lattice defects therein. The protection layer 221 may serve to protect the source/drain electrodes 104a, 104b from being adversely affected by the subsequent process for forming the active layer 107 by providing a barrier over the source/drain electrodes 104a, 104b. The position, the shape, the material, and/or the thickness of the protection layer 221 is so configured that at least one of the advantageous effects including balancing the stress caused by the gate electrode 103 of the TFT 140, increasing the electron mobility of the active layer 107, and protecting the source/drain electrodes 104a, 104b may be achieved.

The protection layer 221 may be disposed over the gate dielectric layer 102. At least a portion of the protection layer 221 may be disposed in the opening 124 defined by the source/drain electrodes 104a, 104b. In some embodiments, at least a portion of the protection layer 221 is in contact with the upper surface 102a of the gate dielectric layer 102. The protection layer 221 may extend from the upper surface 102a of the gate electric layer 102 to the first side surface 141a, 141b of the source/drain electrodes 104a, 104b. The protection layer 221 may extend from the upper surface 102a of the gate electric layer 102 to the first side surface 141a, 141b and the upper surface 113a, 114b of the source/drain electrodes 104a, 104b. The protection layer 221 may extend from the upper surface 102a of the gate electric layer 102 to the first side surface 141a, 141b, the upper surface 102a, and the second side surface 151a, 151b of the source/drain electrodes 104a, 104b.

The protection layer 221 may cover at least a portion of the source/drain electrodes 104a, 104b and at least a portion of the gate dielectric layer 102. A portion of the protection layer 221 may be disposed between the active layer 107 and the gate dielectric layer 102 in the opening 124 defined by the source/drain electrodes 104a, 104b. Another portion of the protection layer 221 may be disposed between the source/drain electrodes 104a, 104b and the first interconnect line 106. A portion of the protection layer 221 may be disposed between the source/drain electrodes 104a, 104b and the first conductive via 139. The protection layer 221 may extend from a positon between the active layer 107 and the gate dielectric layer 102 to a position between the source/drain electrodes 104a, 104b and the first conductive via 139. The protection layer 221 may electrically connect the MRAM cell 111 to the source/drain electrodes 104a, 104b of the TFT 140 through the first interconnect line 106 and the first conductive via 139. The protection layer 221 may surround the active layer 107. In some embodiments, the protection layer 221 is disposed on at least a portion of the upper surface 113a, 113b of the source/drain electrodes 104a, 104b and at least a portion of the upper surface 102a of the gate dielectric layer 102. In some embodiments, the protection layer 221 is disposed in conformity with the shape of the source/drain electrodes 104a, 104b and the opening 124 defined by the source/drain electrodes 104a, 104b.

The protection layer 221 may have a projection area overlapping at least a portion of the active layer 107 or at least a portion of the gate electrode 103 so the stress caused by the gate electrode 103 may be eased. The protection layer 221 may have a projection area overlapping the active layer 107 entirely. The protection layer 221 may have a projection area extending from the source electrode 104a to the drain electrode 104b. The protection layer 221 may have a projection area overlapping the source/drain electrodes 104a, 104b entirely. The protection layer 221 may have a projection area overlapping at least a portion of the gate electrode 103. The protection layer 221 may have a projection area overlapping the gate electrode 103 entirely. The protection layer 221 may have a projection area overlapping the source/drain electrodes 104a, 104b and the gate electrode 103 entirely. The protection layer 221 may have a shape in conformity with the shape of the active layer 107. The protection layer 221 may have a shape in conformity with the shape of the source/drain electrodes 104a, 104b. In some embodiments, the protection layer 221 is a metal layer having a shape in conformity with the shape of the source/drain electrodes 104a, 104b and the opening 124 defined by the source/drain electrodes 104a, 104b.

The protection layer 221 may include a material having a coefficient of thermal expansion (CTE) between that of the gate dielectric layer 102 and that of the active layer 107 so the thermal expansion difference between the gate dielectric layer 102 and the active layer 107 may be reduced. The protection layer 221 may also have a material that may induce the lattice defects of the active layer 107 so the electrode mobility therein may be improved.

By disposing the protection layer 221 between the active layer 107 and the source/drain electrodes 104a, 104b and between the active layer 107 and the gate dielectric layer 102, at least one of the advantageous effects including balancing the stress caused by the gate electrode 103 of the TFT 140, increasing the electron mobility of the active layer 107, and protecting the source/drain electrodes 104a, 104b may be achieved. Although only one protection layer 221 is illustrated in the figures, it should be noted that multiple protection layers 221 may be applied in order to achieve one of the effects mentioned above.

Figure 3:
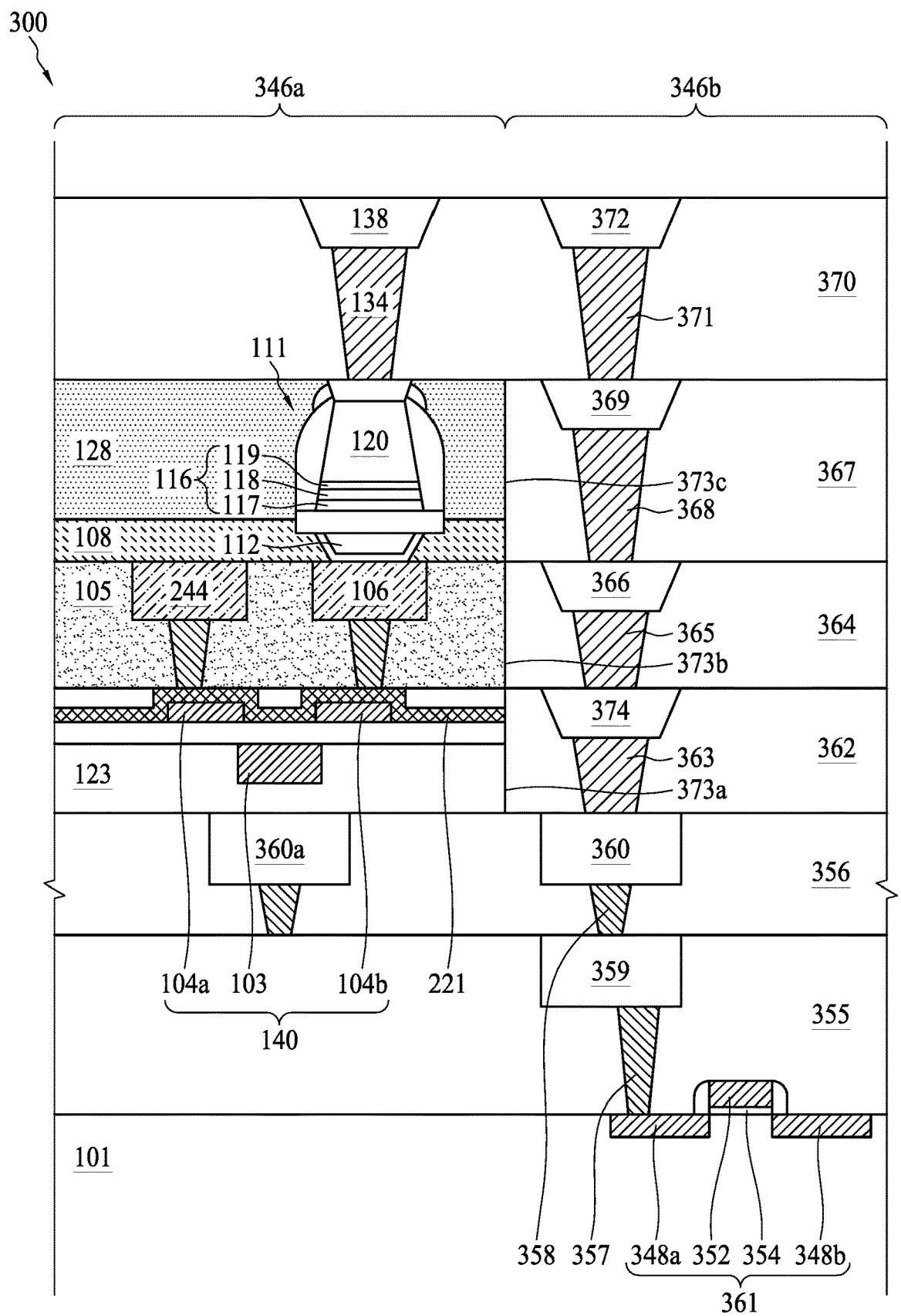
FIG. 3 illustrates a cross-sectional view of an integrated circuit according to some embodiments of the present disclosure.

FIG. 3 illustrates a cross-sectional view of an integrated circuit 300 according to some embodiments of the present disclosure. The integrated circuit 300 includes an embedded memory region 346a comprising a MRAM cell 111 electrically connected to a TFT 140 and a logic region 346b.

The embedded memory region 346a is similar to that illustrated in FIG. 2, which is not described in details for brevity.

The logic region 346b may be disposed adjacent to the embedded memory region 346a. The logic region 346b may include a transistor 361 disposed within the substrate 101 and the first ILD layer 355. The transistor 361 may include a gate electrode 352, a gate dielectric layer 354, and source/drain regions 348a, 348b. A first interconnect line 359 and a first conductive via 357 may be disposed to electrically connect the transistor 361 to other interconnect lines.

A first IMD layer 356, a second IMD layer 362, a third IMD layer 364, a fourth IMD layer 367, and a fifth IMD layer 370 may be disposed over the first ILD layer 355 sequentially, where each IMD layer 356, 362, 364, 367, 370 may include interconnect lines 360, 374, 366, 369, 372 and conductive vias 358, 363, 365, 368, 371 respectively for electrically connecting the interconnect lines 360, 374, 366, 369, 372 to each other.

The logic region 346b may connect to the embedded memory region 346a at an interface 373a between the second IMD layer covering the TFT 140 and the second IMD layer 362 covering the third interconnect line 374 and the third connective via 363, at an interface 373b between the third IMD layer covering the first interconnect line 106 above the TFT 140 and the third IMD layer 364 covering the fourth interconnect line 366 and the fourth conductive via 365, and at an interface 373c between the fourth IMD layer covering the MRAM cell 111 and the fourth IMD layer 367 covering the fifth interconnect line 369 and the fifth conductive via 368. The interfaces 373a, 373b, 373c may exist because of the difference in the materials between the IMD layers or because the IMD layers are formed at different stages.

FIGS. 4A-4E illustrate a method of manufacturing an integrated circuit such as the integrated circuit of FIG. 3 including a memory device such as the memory device of FIG. 2.

Referring to 4A, a logic region is formed on a substrate 101, where a transistor 361 is disposed over the substrate 101. The transistor 361 may include a gate electrode 352, a gate dielectric layer 354, and source/drain regions 348a, 348b.

Referring to 4B, a first interconnect line 359 and a conductive via 357 are disposed in a first ILD layer 355 to electrically connect to the transistor 361. Then, a first IMD layer 356 is disposed above the first ILD layer 355 and a second interconnect line 360a, 360b and a second conductive via 358 are disposed in the first IMD layer 356. The first IMD layer 356 may be disposed by, for example, a chemical vapor deposition (CVD) technology or other suitable technology. The interconnect lines 359, 360a, 360b and the conductive vias 358, 357 may be disposed by a combination of a photolithography technology, an etching technology, a sputtering technology, and a chemical-mechanical polishing technology with a conductive material.

Figure 4A:
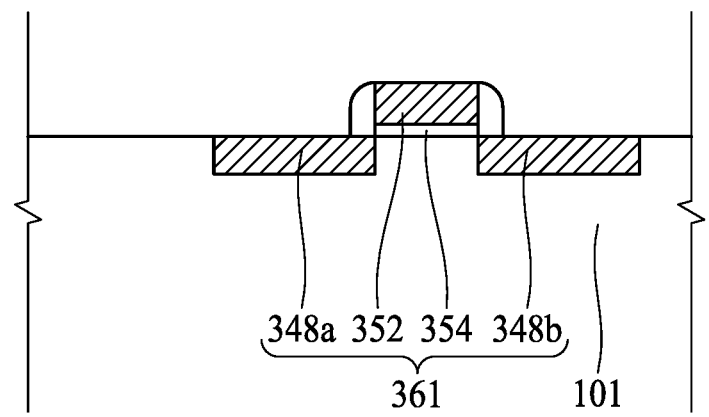
FIG. 4A, FIG. 4B, FIG. 4C, FIG. 4D, and FIG. 4E illustrate a method of manufacturing an integrated circuit such as the integrated circuit of FIG. 3 including a memory device such as the memory device of FIG. 2 according to some embodiments of the present disclosure.
Figure 4B:
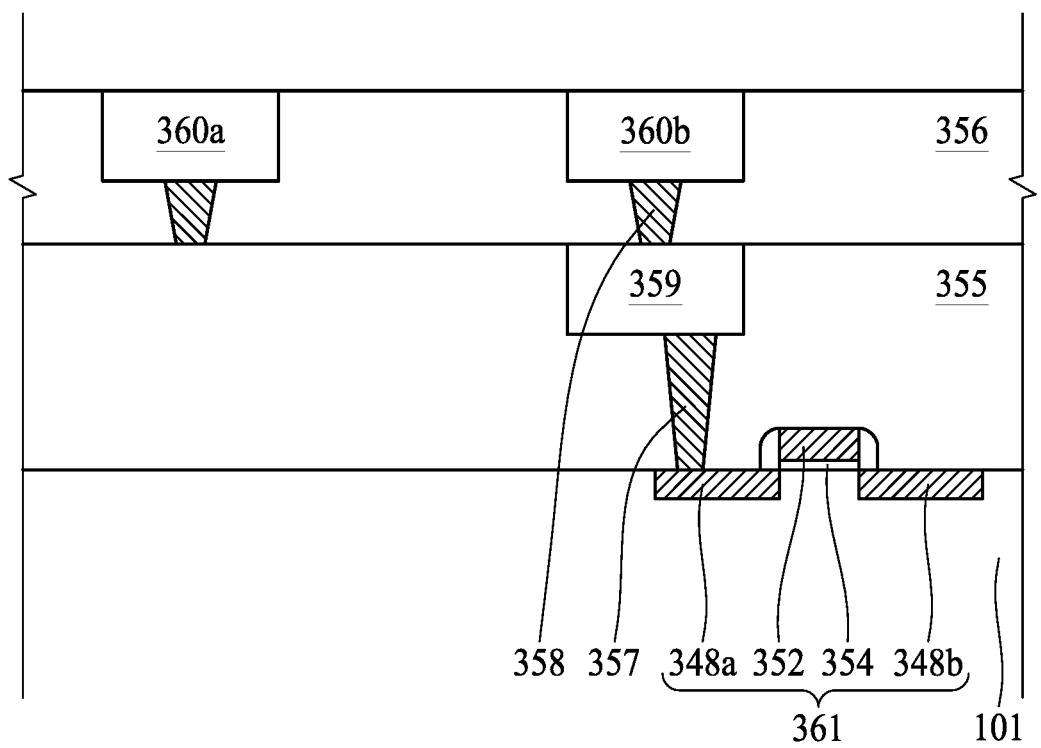
Figure 4C:
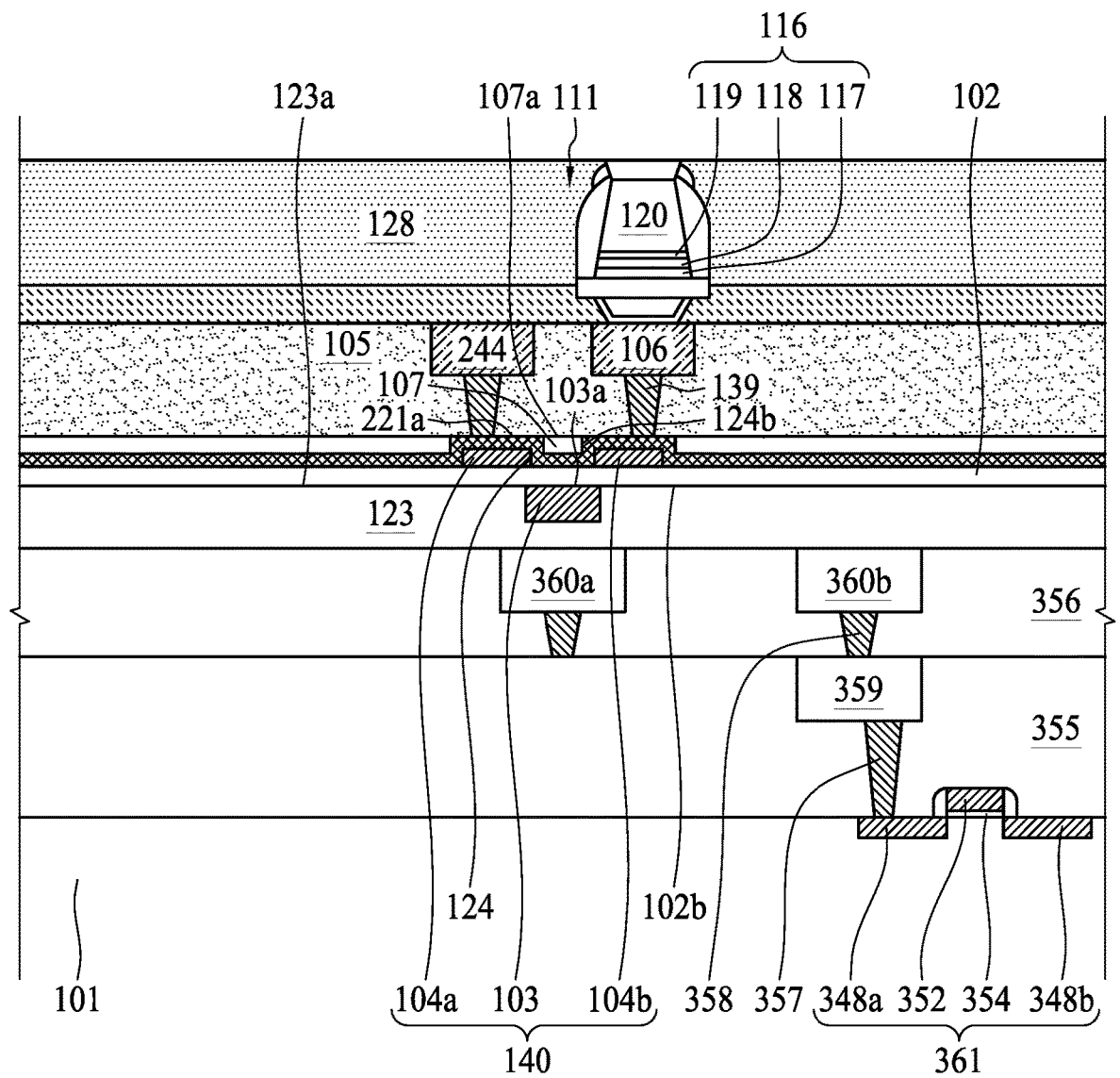

Referring to FIG. 4C, a TFT 140 is disposed over the first IMD layer 356. The TFT 140 may be formed in a second IMD layer. The TFT 140 may be formed as having a gate electrode 103 having an upper surface 103a in substantially coplanar with a bottom surface 102b of the gate dielectric layer 102 or an upper surface 123a of a dielectric layer 123. The TFT 140 may be disposed by a combination of a photolithography technology, an etching technology, a sputtering technology, and a chemical-mechanical polishing technology with suitable materials.

Subsequently, a protection layer 221 is disposed over the gate dielectric layer 102 and the source/drain electrodes 104a, 104b. The protection layer 221 may be disposed in a first opening 124 defined by the source/drain electrodes 104a, 104b and define a second opening 124b. The protection layer 221 may be disposed by, for example, a sputtering technology.

Subsequently, an active layer 107 is disposed in the second opening 124b defined by the protection layer 221 and has an upper surface 107a substantially coplanar with an upper surface 221a of the protection layer 221. The active layer 107 may be disposed by a combination of a photolithography technology, a chemical vapor deposition (CVD) technology, and a chemical-mechanical polishing technology with suitable materials.

Subsequently, a third IMD layer 105 is disposed over the TFT 140 and a third interconnect line 244, 106 and a third conductive via 139 are disposed in the third IMD layer 105. The third IMD layer 105 may be disposed by, for example, a chemical vapor deposition (CVD) technology or other suitable technology. The third interconnect line 139 and the third conductive via 139 may be disposed by a combination of a photolithography technology, an etching technology, a sputtering technology, and a chemical-mechanical polishing technology with a conductive material.

Subsequently, a fourth IMD layer 128 is disposed over the third IMD layer 105. The fourth IMD layer 128 may be disposed by, for example, a chemical vapor deposition (CVD) technology or other suitable technology. Afterwards, suitable technologies may be applied to dispose a MRAM cell 111 in the fourth IMD layer 128 and electrically coupled to the TFT 140. As a result, a memory device 200, such as the one illustrated in FIG. 2 may be obtained.

Figure 4D:
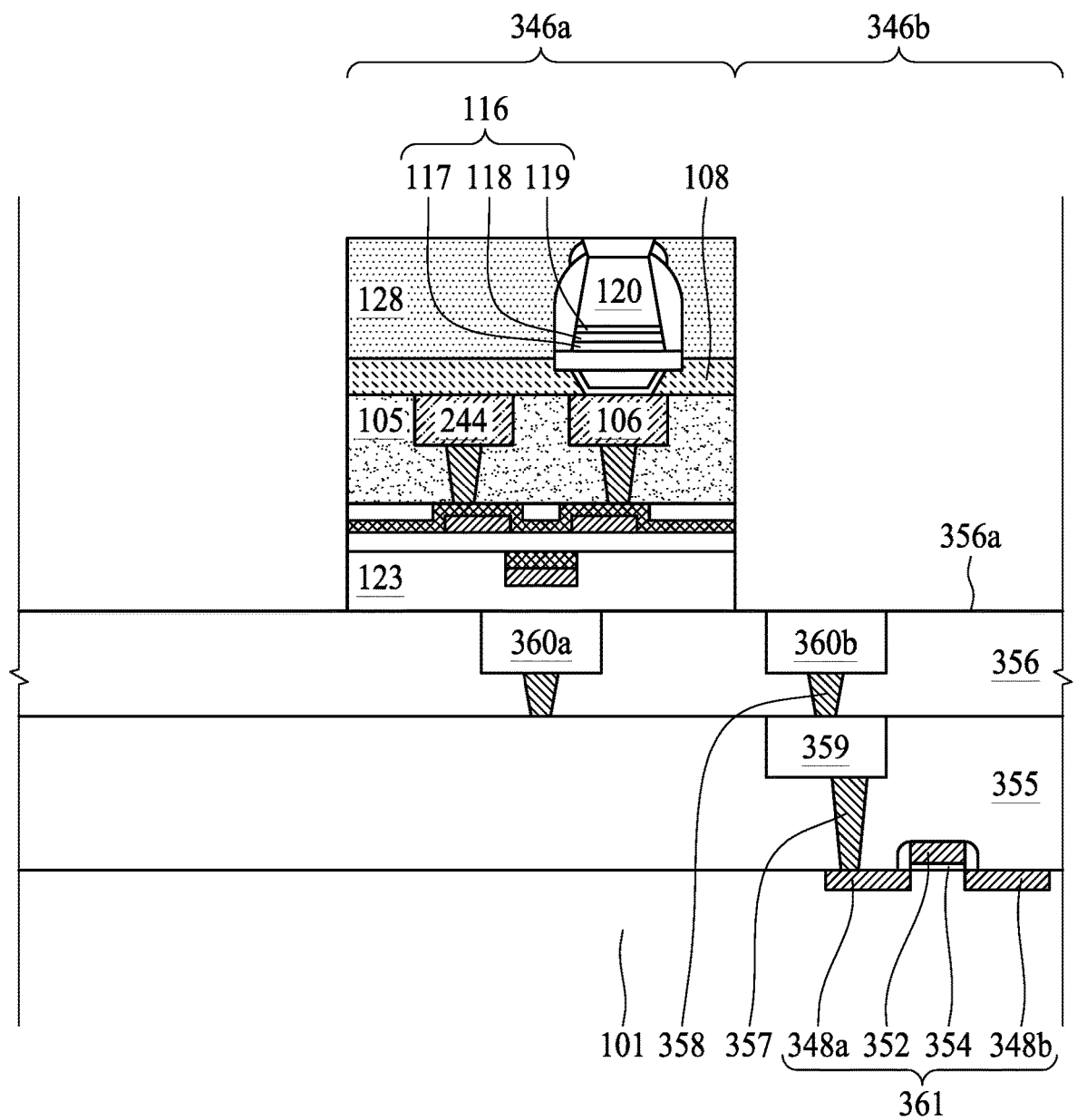

Referring to FIG. 4D, portions of the second IMD layer, the third IMD layer, and the fourth IMD layer surrounding the memory region 346a are removed until a surface 356a of the first IMD layer 356 in the logic region 346b is exposed. The removal of the IMD layers may be performed by a combination of a photolithography technology and an etching technology.

Figure 4E:
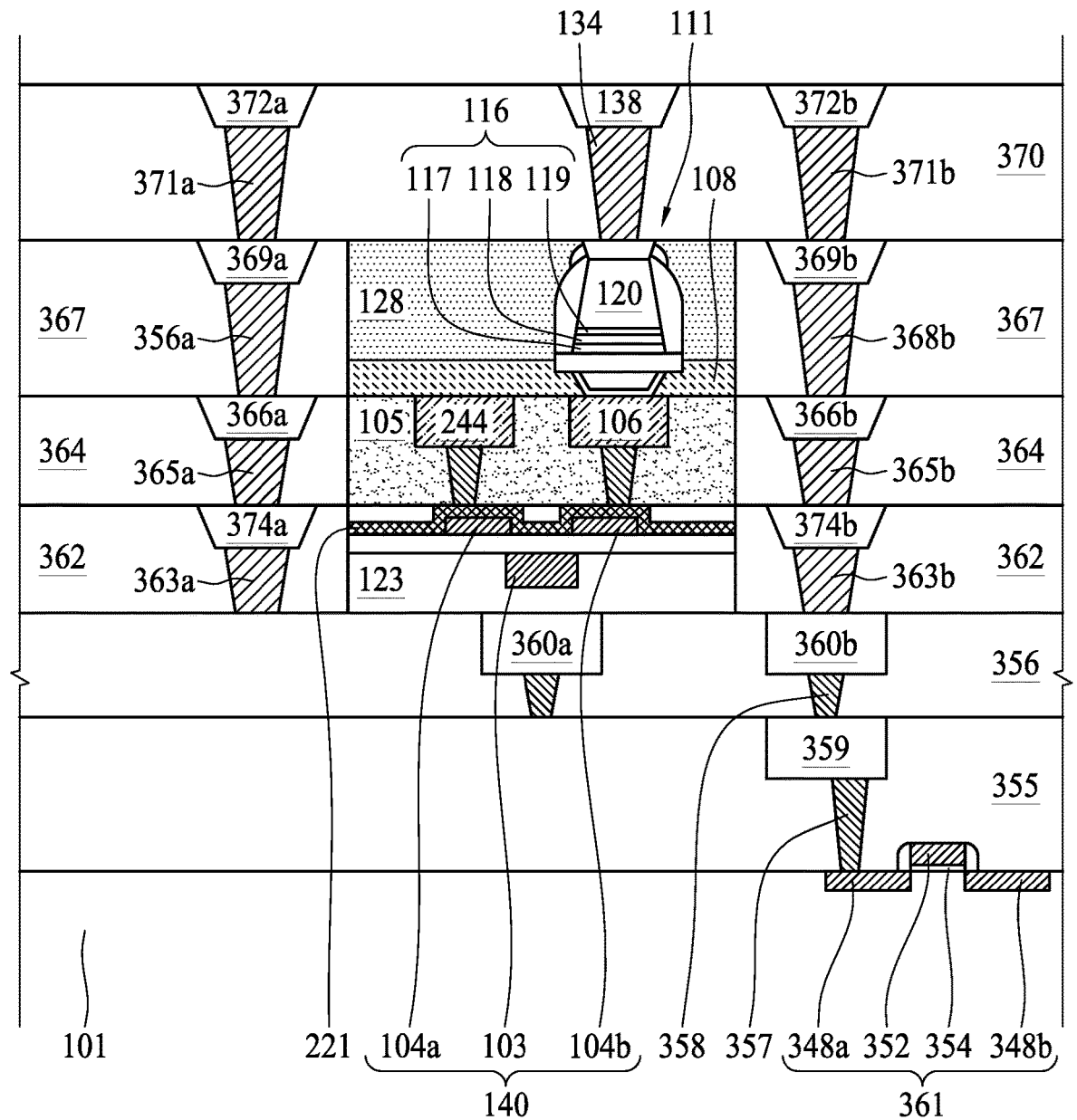

Referring to FIG. 4E, a second IMD layer 362 may be disposed over the exposed first IMD layer 356 and a third interconnect line 374a, 374b and a third conductive via 363a, 363b are disposed in the second IMD layer 362. The second IMD layer 362 may surround the TFT 140. The second IMD layer 362 may be disposed by, for example, a chemical vapor deposition (CVD) technology or other suitable technology. The third interconnect line 374a, 374b and the third conductive via 363a, 363b may be disposed by a combination of a photolithography technology, an etching technology, a sputtering technology, and a chemical-mechanical polishing technology with a conductive material.

Subsequently, a third IMD layer 364 may be disposed over the exposed second IMD layer 362 and a fourth interconnect line 366a, 366b and a fourth conductive via 365a, 365b are disposed in the third IMD layer 364. The third IMD layer 364 may be disposed by, for example, a chemical vapor deposition (CVD) technology or other suitable technology. The fourth interconnect line 366a, 366b and the fourth conductive via 365a, 365b may be disposed by a combination of a photolithography technology, an etching technology, a sputtering technology, and a chemical-mechanical polishing technology with a conductive material.

Subsequently, a fourth IMD layer 367 may be disposed over the third IMD layer 364 and a fifth interconnect line 369a, 369b and a fifth conductive via 356a, 356b are disposed in the fourth IMD layer 367. The fourth IMD layer 367 may surround the MRAM cell 111. The fourth IMD layer 367 may be disposed by, for example, a chemical vapor deposition (CVD) technology or other suitable technology. The fifth interconnect line 369a, 369b and the fifth conductive via 356a, 356b may be disposed by a combination of a photolithography technology, an etching technology, a sputtering technology, and a chemical-mechanical polishing technology with a conductive material.

Subsequently, a fifth IMD layer 370 may be disposed over the fourth IMD layer 367 and the MRAM cell 111 and a sixth interconnect line 372a, 372b, 138 and a sixth conductive via 371a, 371b, 134 are disposed in the fifth IMD layer 370. The fifth IMD layer 370 may be disposed by, for example, a chemical vapor deposition (CVD) technology or other suitable technology. The sixth interconnect line 372a, 372b, 138 and the sixth conductive via 371a, 371b, 134 may be disposed by a combination of a photolithography technology, an etching technology, a sputtering technology, and a chemical-mechanical polishing technology with a conductive material. As a result, an integrated circuit, such as that illustrated in FIG. 3 may be obtained.

In some embodiments, a semiconductor device is provided. The semiconductor device includes a substrate, a thin-film transistor (TFT) over the substrate, and a magnetoresistive random-access memory (MRAM) cell electrically coupled to the TFT. The TFT includes a gate electrode; a gate dielectric layer disposed over the gate electrode; source/drain electrodes disposed above the gate electrode; and an active layer disposed above the gate electrode. A protection layer is disposed between the TFT and the MRAM cell and electrically connects the MRAM cell to the TFT.

In some embodiments, an integrated circuit is provided. The integrated circuit includes a logic region and an embedded memory region. The logic region is disposed on a substrate. The embedded memory region is disposed over the substrate and includes a thin-film transistor (TFT) disposed over the substrate and a magnetoresistive random-access memory (MRAM) cell electrically coupled to the TFT. The TFT includes a gate electrode; a gate dielectric layer disposed over the gate electrode; source/drain electrodes disposed above the gate electrode; and an active layer disposed above the gate electrode. A protection layer is disposed between the TFT and the MRAM cell and electrically connects the MRAM cell to the TFT.

In some embodiments, a method of manufacturing a semiconductor device is provided. The method includes disposing a transistor on a substrate; disposing an inter-layer dielectric (ILD) layer over the transistor; disposing an IMD layer over the ILD layer; disposing a TFT over the IMD layer; and disposing a protection layer over the TFT.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a thin-film transistor (TFT) disposed over the substrate, the TFT comprising:
      a gate electrode;
      a gate dielectric layer disposed over the gate electrode;
      source/drain electrodes disposed above the gate electrode; and
      an active layer disposed above the gate electrode;
   a magnetoresistive random-access memory (MRAM) cell electrically coupled to the TFT; and a protection layer disposed between the TFT and the MRAM cell and electrically connects the MRAM cell to the TFT, wherein the protection layer includes oxide semiconductor material.

2. The semiconductor device of claim 1, wherein a portion of the protection layer is disposed between the source/drain electrodes and the MRAM cell, and the oxide semiconductor material includes IGZO, ITZO, IZO, AGZO, or a combination thereof.

3. The semiconductor device of claim 2, wherein another portion of the protection layer is disposed between the active layer and the gate dielectric layer.

4. The semiconductor device of claim 2, wherein the protection layer extends from the source electrode to the drain electrode.

5. The semiconductor device of claim 1, wherein a portion of the protection layer is disposed in an opening defined by the source/drain electrodes.

6. The semiconductor device of claim 5, wherein another portion of the protection layer electrically connects the MRAM cell to the source/drain electrodes.

7. The semiconductor device of claim 1, wherein the protection layer has a projection area overlapping at least a portion of the active layer.

8. The semiconductor device of claim 7, wherein the protection layer has a projection area overlapping at least a portion of the source/drain electrodes.

9. The semiconductor device of claim 1, wherein the protection layer has a projection area overlapping at least a portion of the gate electrode and at least a portion of the source/drain electrodes.

10. The semiconductor device of claim 1, wherein the protection layer is disposed on the source/drain electrodes and has a shape in conformity with the shape of the source/drain electrodes and an opening defined by the source/drain electrodes.

11. The semiconductor device of claim 1, wherein the active layer has an upper surface higher than an upper surface of the source/drain electrodes.

12. The semiconductor device of claim 11, wherein the TFT is disposed in an inter-metal dielectric (IMD) layer and an upper surface of the gate electrode is in substantially coplanar with a bottom surface of the gate dielectric layer.

13. An integrated circuit, comprising:
a logic region disposed on a substrate; and
an embedded memory region disposed over the substrate, comprising:
a thin-film transistor (TFT) disposed over the substrate, the TFT comprising:
a gate electrode;
a gate dielectric layer disposed over the gate electrode;
source/drain electrodes disposed above the gate dielectric layer and contacting the gate dielectric layer; and
an active layer disposed above the gate electrode;
a magnetoresistive random-access memory (MRAM) cell electrically coupled to the TFT; and
a protection layer disposed between the TFT and the MRAM cell and electrically connects the MRAM cell to the TFT, wherein the protection layer is conformal to the gate dielectric layer and the source/drain electrodes.

14. The integrated circuit of claim 13, wherein a portion of the protection layer is disposed between the source/drain electrodes and the MRAM cell and another portion of the protection layer is disposed between the active layer and the gate dielectric layer.

15. The integrated circuit of claim 13, wherein the protection layer has a projection area overlapping at least a portion of the gate electrode, at least a portion of the active layer, and at least a portion of the source/drain electrodes.

16. The integrated circuit of claim 13, wherein the protection layer is disposed on the source/drain electrodes and has a shape in conformity with the shape of the source/drain electrodes and an opening defined by the source/drain electrodes.

17. The integrated circuit of claim 13, wherein the active layer has an upper surface higher than an upper surface of the source/drain electrodes.

18. The integrated circuit of claim 13, wherein the logic region comprises a transistor and the TFT is spaced from the transistor by at least two dielectric layers.

19. A method of manufacturing a semiconductor device, comprising:
disposing a transistor on a substrate;
disposing an inter-layer dielectric (ILD) layer over the transistor;
disposing an IMD layer over the ILD layer;
disposing a TFT over the IMD layer; and
disposing a protection layer over the TFT, wherein the protection layer includes oxide semiconductor material.

20. The method of claim 19, wherein the protection layer is disposed between an active layer and a gate dielectric layer of the TFT and has a projection area overlapping at least a portion of a gate electrode and source/drain electrodes of the TFT.

* * * * *